United States Patent
Ashari et al.

(10) Patent No.: US 10,572,992 B2
(45) Date of Patent: Feb. 25, 2020

(54) 2D METROLOGY TECHNIQUE FOR SOLDER PASTE INSPECTION

(71) Applicant: Intel Corporation, Santa Clara, CA (US)

(72) Inventors: Alireza Ashari, Scottsdale, AZ (US); Curt Carboni, Chandler, AZ (US); Jason Jones, Mesa, AZ (US); Robert Wiedmaier, Phoenix, AZ (US); Di Xu, Chandler, AZ (US); Wei Yan, Chandler, AZ (US); Liang Zhang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 183 days.

(21) Appl. No.: 15/857,517

(22) Filed: Dec. 28, 2017

(65) Prior Publication Data

US 2019/0206038 A1 Jul. 4, 2019

(51) Int. Cl.
*G06K 9/00* (2006.01)
*G06T 7/00* (2017.01)
(Continued)

(52) U.S. Cl.
CPC .............. *G06T 7/001* (2013.01); *B23K 3/08* (2013.01); *H05K 1/0269* (2013.01); *H05K 3/12* (2013.01);
(Continued)

(58) Field of Classification Search
CPC ...... B23K 1/0016; B23K 1/008; B23K 1/012; B23K 2101/42; B23K 31/12; B23K 3/08; G06T 2207/30152; G06T 7/001; H05K 1/0269; H05K 2203/163; H05K 3/12; H05K 3/3484
See application file for complete search history.

(56) References Cited

U.S. PATENT DOCUMENTS 6,167,148 A * 12/2000 Calitz ............... G01N 21/9501
348/126
6,697,151 B2 * 2/2004 Owen .................... B23K 3/08
356/237.1
(Continued)

*Primary Examiner* — Bhavesh M Mehta
*Assistant Examiner* — Ian L Lemieux
(74) *Attorney, Agent, or Firm* — Schwegman Lundberg & Woessner, P.A.

(57) ABSTRACT

A method, apparatus and computer readable memory for solder paste inspection. A light source is configured to irradiate a sample solder joint comprising an organic material, an organic and metal material enclosed by an irregular boundary, and a metal material enclosed by a regular boundary. A first wavelength ultraviolet (UV) energy irradiates the sample to obtain first fluorescence energy, and a second wavelength UV energy irradiates the sample to obtain second fluorescence energy. A two-dimensional (2D) camera is configured to acquire a first image of the sample primarily from the first fluorescence energy and a second image of the sample primarily from the second fluorescence energy. Photo manipulation software is stored on at least one hardware processor, the photo manipulation software configured to overlay the first image and the second image to visually compare the boundary of the organic and metal material with the boundary of the metal material.

36 Claims, 8 Drawing Sheets

(51) Int. Cl.
*H05K 3/12* (2006.01)
*H05K 3/34* (2006.01)
*B23K 3/08* (2006.01)
*H05K 1/02* (2006.01)

(52) U.S. Cl.
CPC .. H05K 3/3484 (2013.01); *G06T 2207/30152* (2013.01); *H05K 2203/163* (2013.01)

(56) References Cited

U.S. PATENT DOCUMENTS

| | | | | |
|---|---|---|---|---|
| 2002/0030808 | A1* | 3/2002 | Bostrom | G01B 11/04 356/237.2 |
| 2003/0113009 | A1* | 6/2003 | Mueller | G06T 7/0002 382/147 |
| 2015/0201499 | A1* | 7/2015 | Shinar | H05K 3/125 425/132 |
| 2015/0201500 | A1* | 7/2015 | Shinar | H05K 3/125 425/132 |
| 2015/0276621 | A1* | 10/2015 | Zhang | G03F 9/7046 250/341.8 |

* cited by examiner

2D METROLOGY TECHNIQUE FOR SOLDER PASTE INSPECTION

FIELD

The present description relates to quality control in solder paste printing in microelectronic structures and, in particular, to post-printing solder paste inspection (SPI).

BACKGROUND

Solder paste printing is a key process for modules such as Ball Attach (BA) modules and its quality control is one of the most critical tasks for second level inspection. However, there exist many challenges for the BA Solder Paste Inspection (SPI) process. Generally, the dimensions, geometry, color and transparency of solder paste materials can vary dramatically in the BA process. Therefore, a fast, precise and reliable post-printing SPI technique that can accurately inspect such parameters as flux and paste dispense to help insure a good solder joint for the BA module, despite such variation, is in demand. This demand can be met by the multi-level fluorescence imaging technique for organic materials disclosed herein.

DETAILED DESCRIPTION

One of several challenges facing the BA SPI process in solder paste printing is roadmap change. For example, introducing a solder paste jet printing process to replace a traditional stencil printing process causes smaller (and therefore more difficult to inspect) dot size. Another challenge is that new paste materials are often introduced with varied metallic loadings. This will cause large appearance variations in color and transparency to the Solder Resist Opening (SRO) or Solder Resist (SR) backgrounds. Still another challenge or problem is that as thinner substrates are used, larger substrate warpage variation occurs, resulting in uneven printing or mismatched pattern(s). Another further challenge or problem can be introduced to the SPI process by reduced form factor of the solder ball size and the spacing in between solder balls.

Previous solutions to the above problems, or similar problems, involved the use of a currently available laser confocal tool as the process of record (POR) tool at the factory floor for an offline SPI task. However, due to a smaller scale of BA SPI compared to traditional SPI applications, there is no current off-the-shelf commercial inline tool available to take over the SPI. Current off-the-shelf tools have several disadvantages. For example, they may suffer from low throughput. Typically it takes 1-2 minutes to scan a 2 mm×2 mm area for 3D data collection. For this reason, the BA SPI process has to be sampled and only the Pin1 fiducial area on the units have been measured. Another disadvantage is that such current off-the-shelf tools lack 2D measurement capability for solder paste (SP) dimension measurement.

Figure 1A:
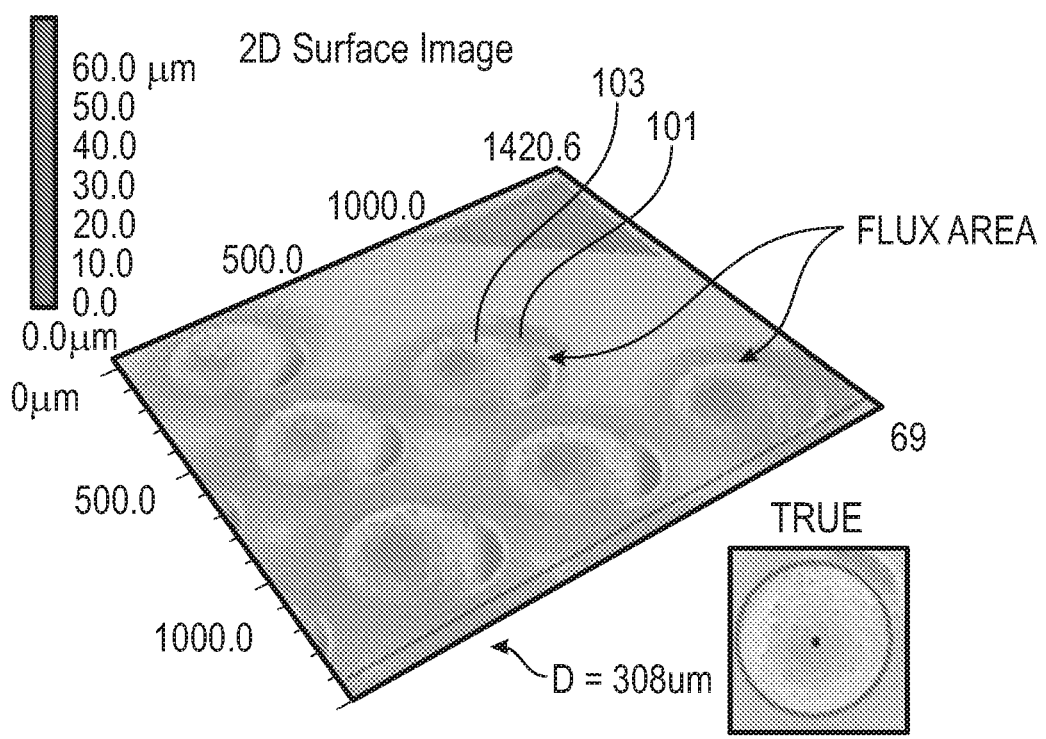
FIGS. 1A and 1B illustrate data loss from 3D measurement of a solder paste (SP)/solder resist opening (SRO) sample, according to some embodiments.
Figure 1B:
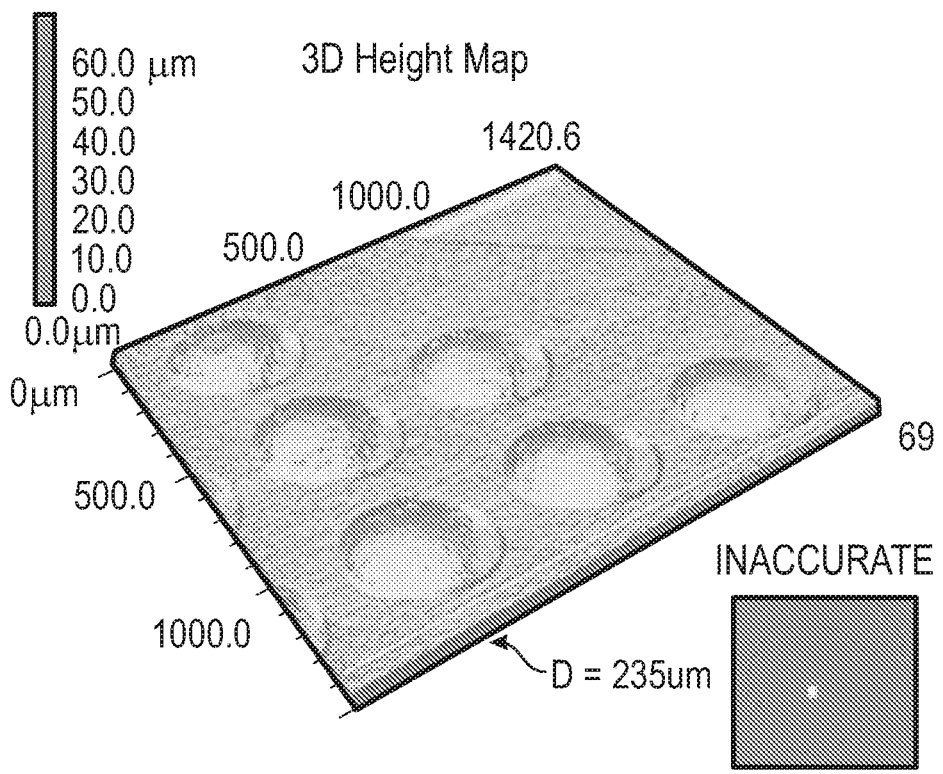

FIGS. 1A and B illustrate data loss on 3D measurement of a SP/SRO sample. As used in this context, an SRO is one metallic opening (of many) in, for example, a ball grid array (BGA). The opening is metallic and therefore distinct from solder resist, and consequently attracts solder for reflow during the manufacturing process, for electrical connection in the product. Data loss can result from the above-mentioned lack of 2D measurement capability for solder paste dimension measurement. For example, a currently used POR BA SPI tool has no 2D image sensor and its 2D data is directly converted from 3D. Because its 3D module uses a microscope objective with relative small numerical aperture, the data at the bottom of solder balls are usually missing. This is a common shortcoming for essentially all current 3D optical profiling tools which generally inevitably generate under-estimated diameters for high profile objects such as solder paste blobs and solder balls as illustrated in FIGS. 1A and 1B. In FIG. 1A, item 101 in the photograph is the solder paste or solder flux (or "glue") boundary (irregular) on which a solder ball would be placed. Item 103 in the photograph is an SRO boundary (circular). As seen in the TRUE circle of FIG. 1A, there are very small or very tiny solder balls in the solder paste, which help provide a secure connection. In FIG. 1A a 2D image, overlaid on 3D data, shows accurate paste diameter data measurement data. FIG. 1B shows an approximately twenty-five percent (25%) smaller diameter measured from the 3D height only (235 microns diameter for the view of the SOR, versus 308 microns for the diameter, as illustrated in FIGS. 1A and 1B, respectively), due to lack of 2D measurement capability. As can be seen in FIG. 1B, after noise filtering and tilt correction, 3D alone results data around the edge being lost. In other words, lack of 2D measurement capability renders a tool unable to measure flux area accurately. That 25% data loss using 3D makes the inspection decision making much more difficult, which is improved by the much more accurate dimension representation in 2D.

As shown on FIGS. 1A and 1B, based on the image contrast, a 2D image has the capability of detecting the flux around the paste. This also illustrates an inability of 3D alone to separate or measure opaque SP vs. SROs if the SROs are fully covered by solder paste.

The above problems can be resolved using the multi-level fluorescence imaging technique for organic materials visual inspection described herein, because organic materials will have significant ultraviolet (UV) fluorescence and different organic materials will have different fluorescence responses. By choosing proper UV excitation wavelengths of the light source, images with optimized contrast can be selectively obtained for "solder paste-on-SRO" and "solder paste-on-SR" cases in-situ. Subsequently the image can be used to segment and measure the solder paste boundary (for example the irregular boundary of item 101 in FIG. 1A) and the SRO boundary (for example the circular boundary of SRO 103 of FIG. 1A) with high accuracy. In other words, the image can be used to measure what can be viewed as the "offset" between the solder paste boundary and the SRO boundary. This 2D imaging technique may be used for SPI applications for the BA module to perform the above segmenting and measurement with a high degree of accuracy. It has the advantage of being fast and providing more accurate results that can ensure the quality of solder paste printing processes. This technique and apparatus fills the gaps in semiconductor assembly by resolving the above-described challenges and problems.

Figure 2:
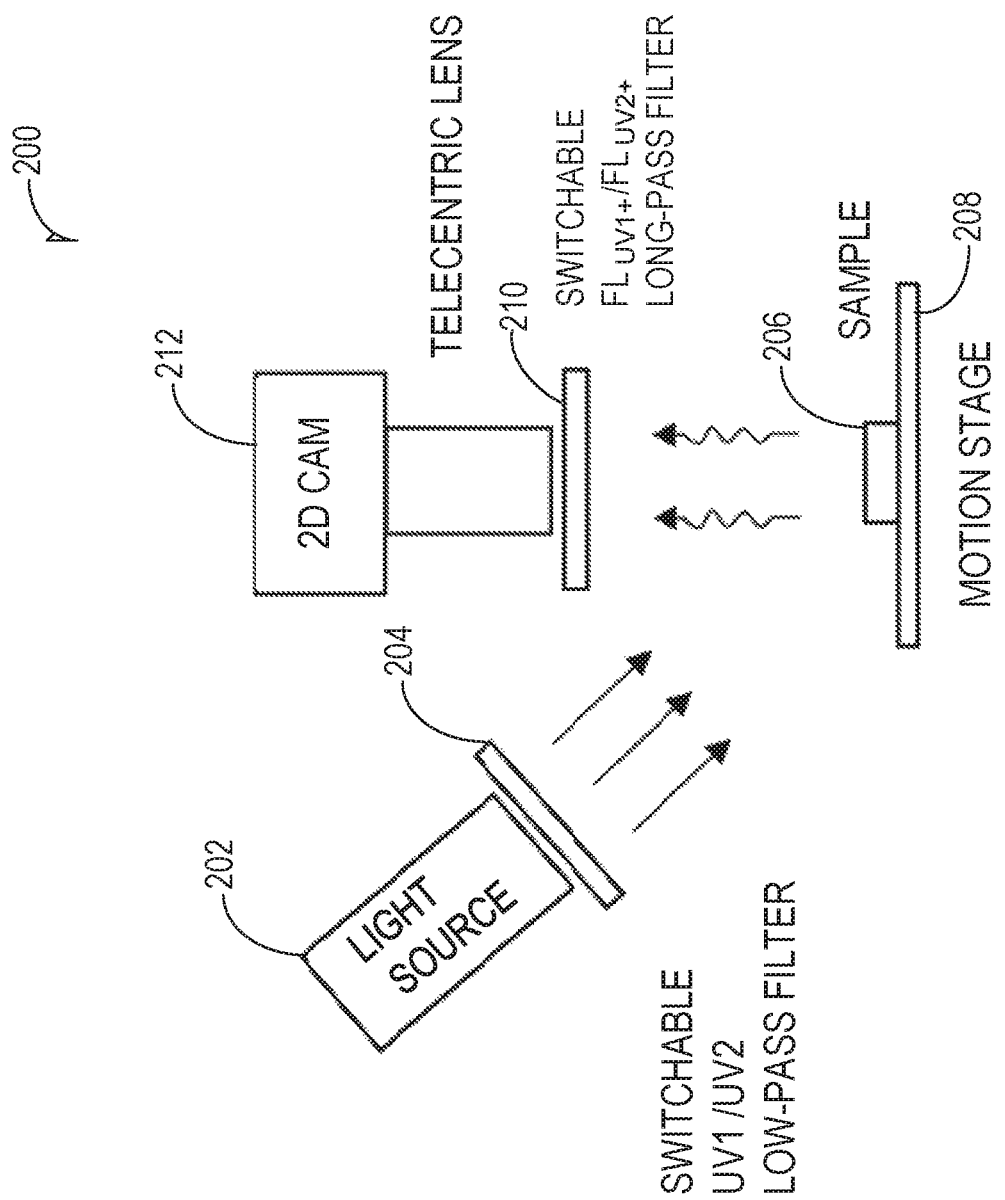
FIG. 2 is illustrates a multi-excitation fluorescence imaging apparatus, according to some embodiments.

FIG. 2 is illustrates a multi-excitation fluorescence imaging apparatus, according to some embodiments. Functional wavelength ranges react with a material being measured, the ranges generally including ultraviolet wavelengths. Ultraviolet (UV) light, in some embodiments, is in two ranges, UV1 and UV2, to excite a printed solder paste sample at different photon energy levels to obtain fluorescence images with optimized contrast to SR or SRO backgrounds. Subsequently, an image processing technique may be used to segment the solder paste boundary and the SRO boundary to calculate the dimensions and printing offset. At the input of FIG. 2 a switchable low-pass filter is used to incident the UV1 (or UV2) wavelength light from light source 202 onto the solder paste samples 204. In some embodiments excitation wavelength UV1 is in the range of 250 nm±50 nm and excitation wavelength UV2 is in the range of 350±50 nm. At the receiving end, another switchable long pass filter 210 is used to block the reflected UV light, allowing $FL_{UV1}$ or $FLU_{V2}$ or longer wavelength to be received by a large field of view camera 212 via switchable long pass filter 210. The "+" stands for the corresponding wavelength for the reflected fluorescence light, which in some embodiments may be beyond a UV wavelength. In some embodiments $FL_{UV1}$ is the cutoff frequency of long-pass filer 210 in a first switchable state and $FL_{UV2}$ is the cutoff frequency of long-pass filter 210 in a second switchable state. Those of ordinary skill in the art will recognize that switchable filter 210 could be implemented by two separate filters each at the appropriate cutoff frequency discussed. Images are "grabbed" or acquired at two types of reflected fluorescence light by way of switchable long-pass filter 210. The entire imaging system may be fully automated by commercial integration for image acquisition, light source control, and filter selection and switching. For some embodiments fluorescence wavelength of $FL_{UV1}$ is in the range of 325 nm and longer and fluorescence wavelength of $FL_{UV2}$ is in the range of 418 nm and longer. The samples are kept still or motionless during image acquisitions under different illuminations, or excitation of UV1 and UV2, with the different reflected or fluorescence energy being of $FL_{UV1}$ and $FL_{UV2}$, respectively.

One embodiment using the UV ranges of the prior paragraph is as follows. At the input of FIG. 2, a switchable low-pass filter 204 is used to incident the 280 nm or 365 nm UV wavelength, light (280 nm being within the UV1 range and 365 nm being within the UV2 range) from light source 202 onto the solder paste samples 206. At the receiving end, another switchable long pass filter 210 with cutting frequency at 325 nm or 418 nm UV wavelength light (325 nm being within the $FL_{UV1}$ range and 418 nm being within the $FL_{UV2}$ range) is used to block the reflected UV light, while allowing the fluorescence ($FL_{UV1}$ or $FL_{UV2}$) or longer wavelength light (indicated by the vertical arrows) to be received by a large field of view 2D camera 212 via switchable long pass filter 210. The samples are kept still or motionless during image acquisitions and illumination switching by switchable filter 204. In some embodiments an XY motion stage 208 is used to switch the field of views to cover the full sample surface.

Figure 3A:
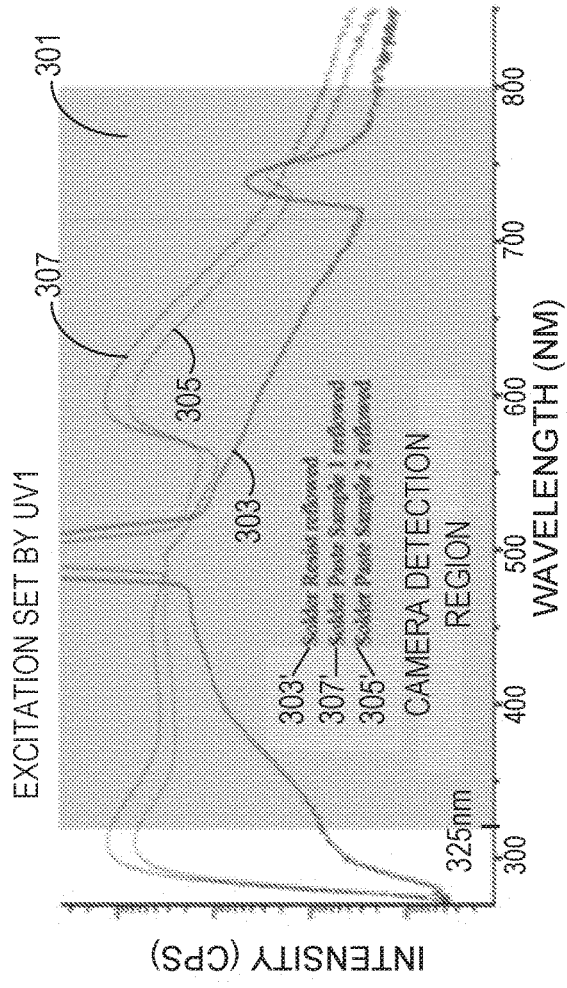
FIG. 3A is a graph of fluorescence spectra measurement results for solder resist and for two types of flux organic compounds after reflow, the measurement using a mid-ultra violet range excitation wavelength, according to some embodiments.
Figure 3B:
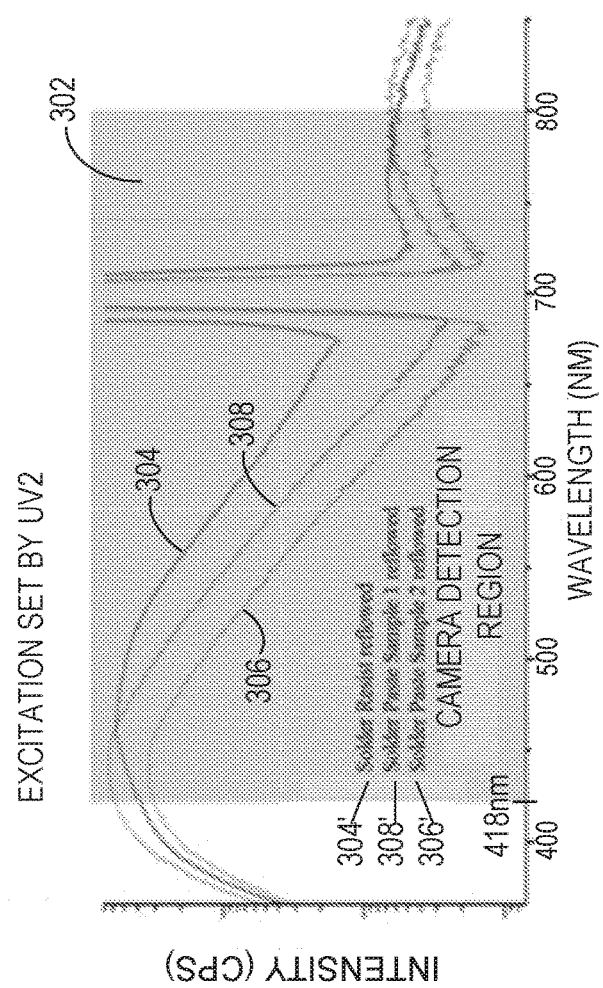
FIG. 3B is a graph of fluorescence spectra measurement results for the same solder resist of FIG. 3A and for the same two types of flux organic compounds, after reflow, for FIG. 3A, the measurement using a near-UV range excitation wavelength, according to some embodiments.

Organic materials can generate fluorescence, whereas metal materials have substantially no fluorescence. The ball attach (BA) solder paste samples are comprised mainly of solder paste (metal and organic flux), SRO (metal) and SR (organic) materials. In some embodiments, if higher energy excitation such as 280 nm UV (within mid-UV range), is used at the input via light source 202 and switchable filter 204, the fluorescence of flux material is much stronger than the fluorescence of the solder resist; while if 365 nm UV (within near-UV range) is used at the input via light source 202 and switchable filter 204, the fluorescence of solder resist (SR) material is dominant and the an image is acquired by camera 202 primarily from fluorescence of the flux material. This gives a good contrast of images. FIG. 3A is a graph of fluorescence spectra measurement results for solder resist 303 and for two types of flux organic compounds 305, 307 after reflow, the measurement using a mid-ultra violet (UV))) excitation wavelength in the UV1 range λ=250±50 nm, according to some embodiments. FIG. 3B is a graph of fluorescence spectra measurement results for the same solder resist 304 as in FIG. 3A and the same two types of flux organic compounds 306, 308 after reflow, as in FIG. 3A, the measurement using a near UV excitation wavelength in the UV2 range λ=350±50 nm, according to some embodiments. In FIGS. 3A and 3B the camera detection regions 301, 302 are the wavelengths of reflected fluorescence collected by the 2D camera 212 after the long-pass filter(s) 210. In other words, the wavelength regions detected by camera 212 in FIG. 3A and FIG. 3B are essentially the wavelengths allowed by the pass bands of the respective filter as seen on the horizontal axes indicated for the Camera Detection Regions of FIGS. 3A and 3B. As an introductory point, the peaks seen in both FIG. 3A and FIG. 3B are an artifact of the system and do not indicate a peak value of interest. In viewing FIGS. 3A and 3B the reader should consider the curves to be essentially smooth where the artifact peaks are located, instead of considering the illustrated peak value of the curve important at that point. In other words, in FIG. 3A, if the peak is removed, solder paste curves 305, 307 have the stronger reflectance signal and have a maximum fluorescence at about a wavelength of $FL_{UV1}$=450 nanometers for an excitation wavelength of UV1. Also, in FIG. 3B the solder resist curve 304 has the strongest reflectance signal, stronger than the two solder paste sample reflection signals 306, 308. The differences illustrated in FIGS. 3A and 3B illustrate the principle of this disclosure, that of using the described multi-level fluorescence imaging technique for organic materials visual inspection, because organic materials will have significant ultraviolet (UV) fluorescence and different organic materials will have different fluorescence responses. Some 2D cameras have camera settings that depend on the intensity of the LED lights in use, which can vary from camera to camera. Therefore, after applied auto-exposure and auto-gain of the detecting camera are set, very good contrasted images for "bright-solder paste" or "bright-SR" over a dark-background can be obtained.

Figures 4A, 4B, 4C:
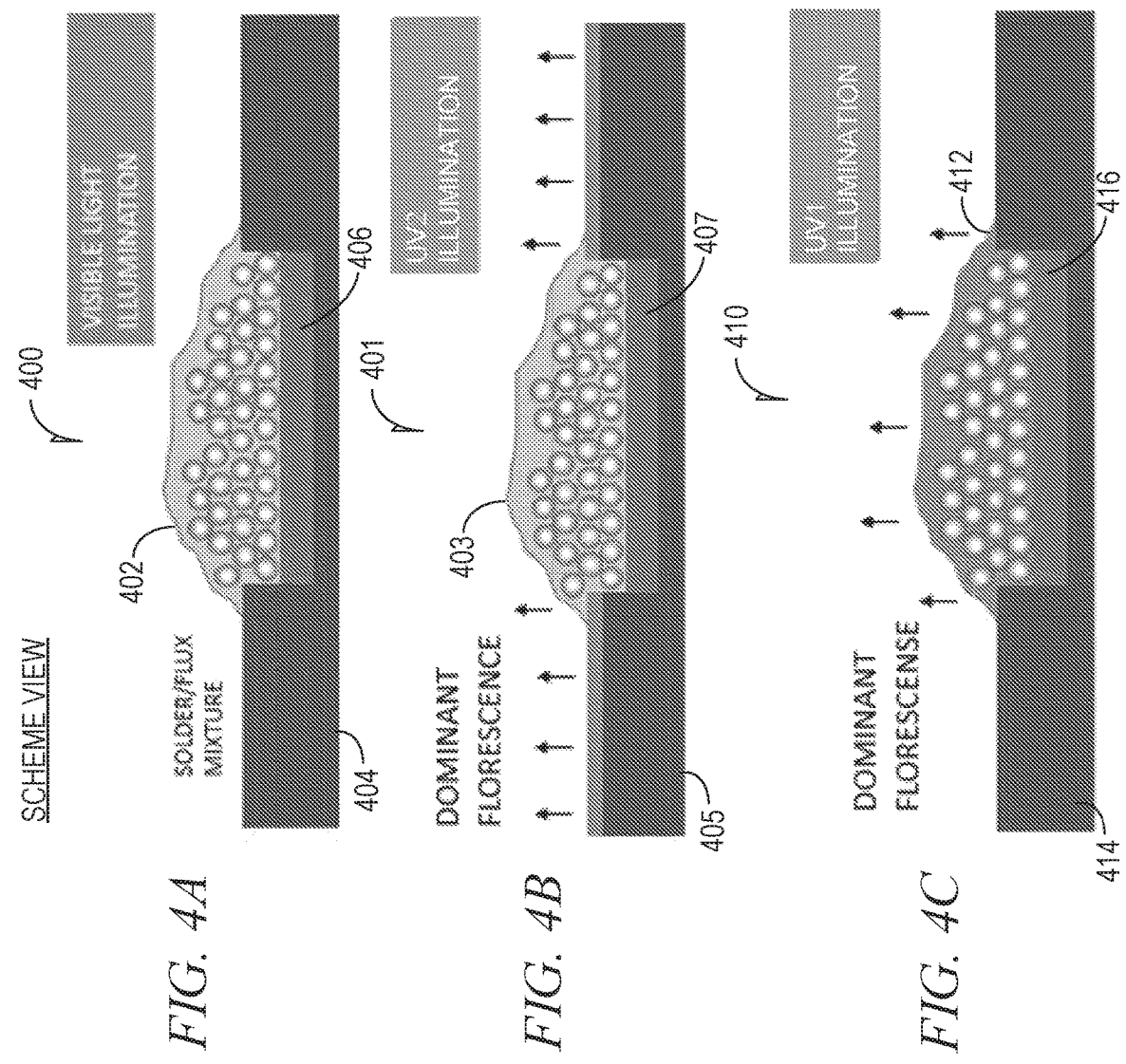
FIGS. 4A-4C illustrate the principle of a fluorescence imaging technique to image SP and SRO for visible light illumination, UV1 illumination and UV2 illumination, according to some embodiments.

FIGS. 4A-4C also illustrate the principle of a fluorescence imaging technique to image the solder paste and SRO for visible light illumination, UV illumination and UV2 illumination, according to some embodiments. The fluorescence results and explanation of those results are illustrated in FIGS. 4A-4C. Images of the same sample are taken under dark field visible line light excitation in FIG. 4A, at 400, UV2 excitation of 365 nm UV in FIG. 4B, at 401 and UV1 excitation of 280 nm UV in FIG. 4C, at 410 respectively. The images illustrate that the solder paste 402 and SRO regions 406 (taking FIG. 4A as an example) are essentially visually inseparable under visible light. The camera view at 400' illustrates that with visible light the camera cannot make out the boundary between the solder resist and solder resist opening. If the illuminator is changed to UV2 light, 365 nm UV in the current example, via switchable low-pass filter 204, FIG. 4B illustrates by the vertical arrows that the 2D camera 212 of FIG. 2 will receive a much stronger signal of the fluorescence $FL_{UV2}$ from SR 405 than those from flux 403 and SRO 407 and the an image is acquired by camera 202 primarily from fluorescence of the solder resist material. If proper exposure time is set for the camera, from the image the SR 403' or SRO 405' can be easily segmented out of the background as seen in camera view 401', essentially no matter how much the SR and SRO are covered by the paste. Similarly, in some embodiments the system may be switched to 280 nm UV input illumination in the embodiment under discussion, via switchable low-pass filter 204, and as seen in FIG. 4C the fluorescence of the flux 412 is dominant as illustrated by the vertical 407 arrows. The area of flux can then be segmented out from the image easily as seen in camera view 410'. For visualization purposes in the embodiment under discussion, the 280 nm and 365 nm fluorescence images for UV1 and UV2 excitation from FIGS. 4B-4C may be overlaid at the same location to compare the boundaries of SRO and paste. The zoom-in views illustrate that the segmented contours match the real boundaries very well where 416' is the (round) SOR boundary and 412' is the (irregular) paste or solder flux mixture boundary. Samples with different printing qualities have been tested and this method has been proven very effective for paste-over-SRO segmentation.

Figures 5A, 5B, 5C:
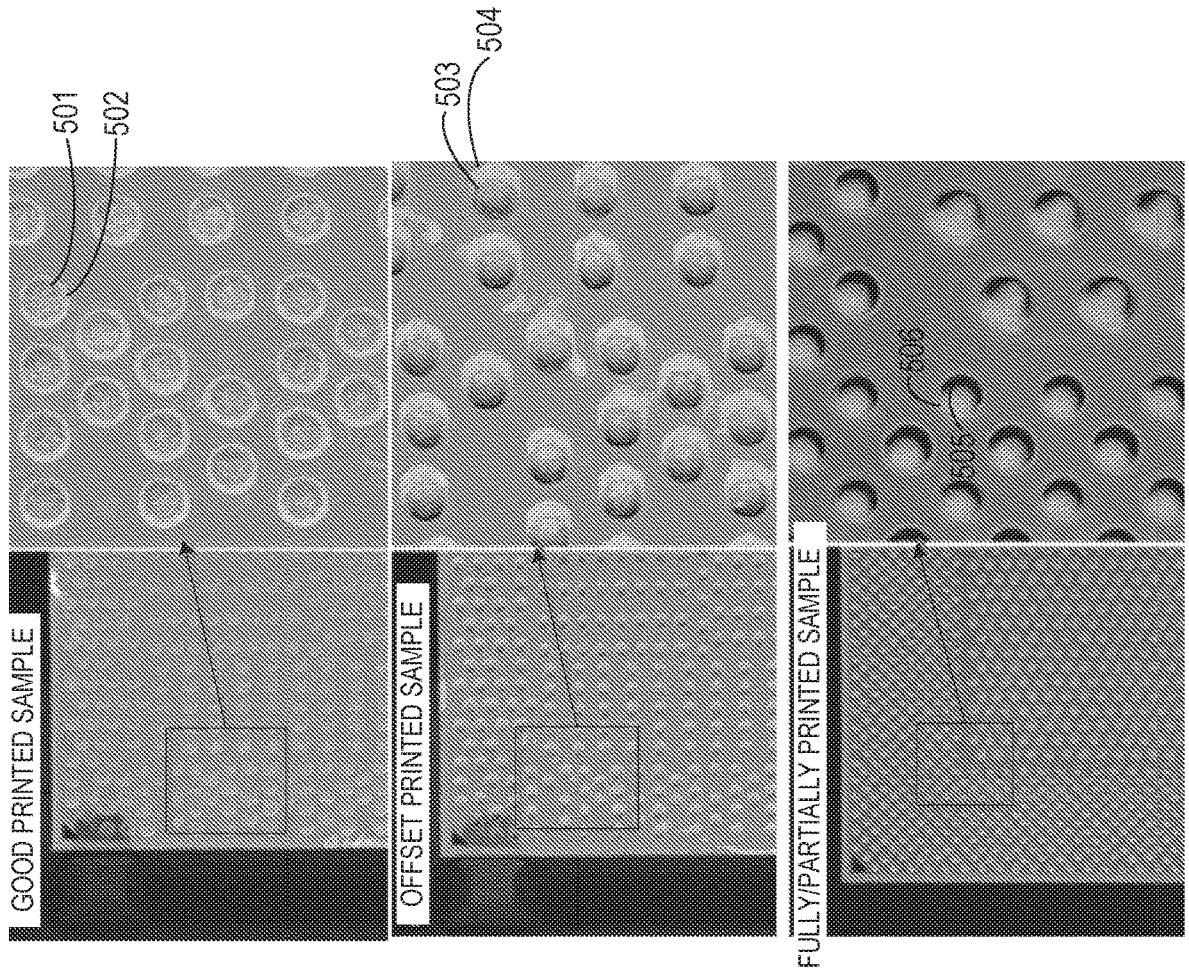
FIGS. 5A-5C illustrate detection of SP for different paste printing scenarios using the multi-excitation fluorescence method and apparatus of FIG. 2, according to some embodiments.

The entire image acquisition can be performed at high-speed at milliseconds per location for a semiconductor or other device under inspection having many sample points such as that seen in FIGS. 6A and 6B, discussed below. As will be discussed next, as illumination energy is increased, for example by increased power, more metal can be observed from the image. FIGS. 5A-5C illustrate detection of solder paste for different paste printing scenarios using the multi-excitation fluorescence technique of FIG. 2, according to some embodiments, results of which were discussed with respect to FIGS. 4A-4C. Using the above-discussed image processing technique, FIGS. 5A-5C show the detected and segmented SRO and paste boundaries on low metal loading solder paste samples. As background, the term "metal loading" is a term of art in the flux industry or in the paste industry, or in the BGA industry. Generally, the difference between low metal loading and high metal loading depends on the quantity of the very small or very tiny solder balls, discussed with respect to FIG. 1A, and seen more clearly in FIGS. 4A-4C, above, that is in the solder paste. The term can be thought of as a percentage of solder that comprises the paste. The greater the percentage of such solder balls in the paste, the higher the metal loading of the paste. The lower the percentage of such solder balls in the paste, the lower the metal loading of the paste. A paste comprising less than fifty percent of such solder balls may be considered a low metal loading paste and a paste with more than fifty percent of such solder balls may be considered a high metal loading paste. As additional background, there are two processes for providing the solder ball that is part of the joint being inspected. One process is to place a solder ball on the reflow. A second process is, with very high loading paste, the reflow itself can provide the solder ball. In other words in the second process the paste melts into its own solder shape. Both processes are used implementing solder joints in BA modules.

The three left images of FIGS. 5A-5C comprise blended fluorescence images taken at 365 nm UV and 280 nm UV excitation, for the embodiment under discussion, with both SRO boundaries and SP boundaries highlighted for three printing scenarios. The left image of FIG. 5A illustrates a good printed sample, where "good printed sample" means, in this context, a sample from the module under test where the ball center and the solder paste center are very close to each other. The left image of FIG. 5B illustrates an offset printed sample, where "offset" means, in this context, that the center of the solder paste is offset to the center of the ball, and almost out of the boundary of the ball. The left image of FIG. 5C illustrates a fully/partially printed sample, where "fully/partially printed" means, in this context, that the ball area is not fully covered by the solder paste, and some of the SRO is uncovered. This exhibits itself as the black crescent moon shaped part of the right image of FIG. 5C.

The three right images of FIGS. 5A-5C are zoom-in views that show the segmentation well-defined for SRO boundaries 501, 503, 505, which are essentially circles, and solder paste boundaries 502, 504, 506, which are irregular boundaries. The crescent moon shaped areas in the right image of FIG. 5C is part of the pad at each point. In some embodiments, if there is a solder resisting opening, the pad can be visible, or exposed, depending in some embodiments on whether a print or a dispense is being performed. If the pad is visible (exposed), there is a good chance that there is a bad solder joint because there may not be enough paste down when the solder is reflowed.

Figure 6A:
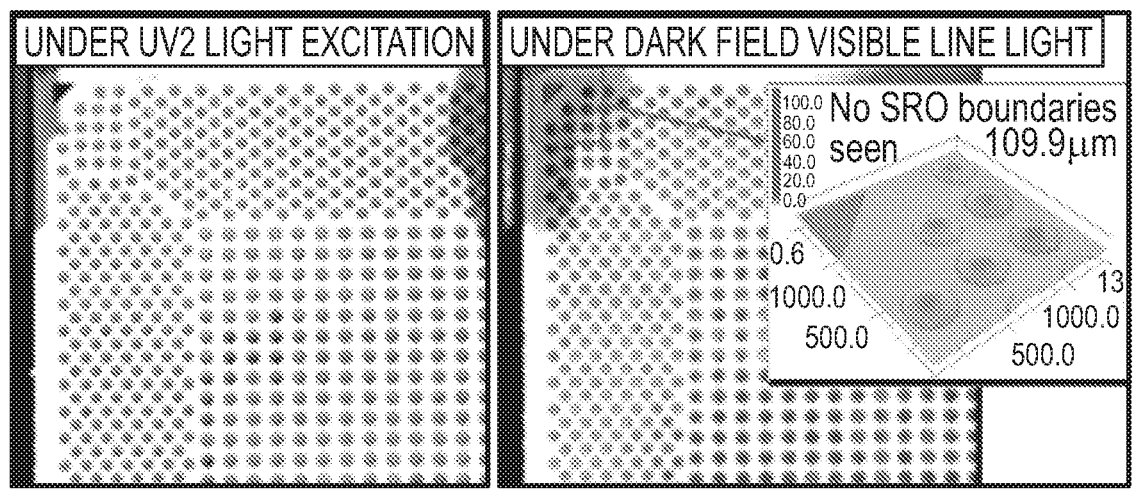
FIGS. 6A and 6B illustrate high accuracy detection of both buried SRO and high metal loading SP boundaries using the multi-excitation fluorescence technique of FIG. 2, according to some embodiments.
Figure 6B:
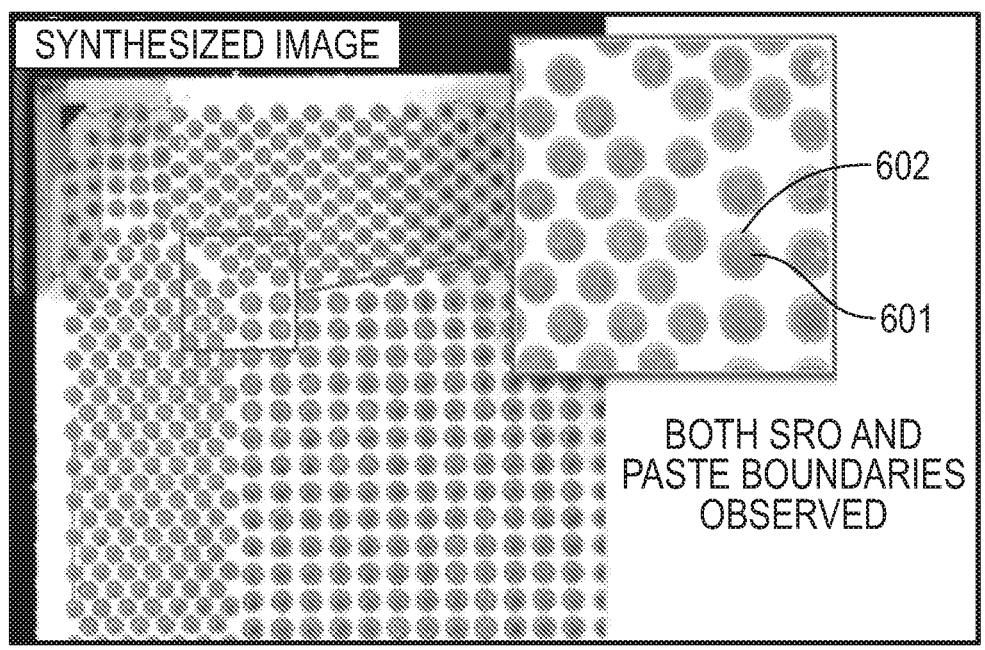

FIGS. 6A and 6B illustrate high accuracy detection of both buried SRO boundaries and high metal loading solder paste boundaries using the multi-excitation fluorescence technique discussed with respect to FIG. 2, the results of which are discussed with respect to FIGS. 4A-4C. FIGS. 6A and 6B resulted from additional tests that have been done on high metal loading paste samples. Certain challenging samples with SRO boundaries fully covered with paste and which can hardly be seen by other regular imaging tools were chosen. The right image of FIG. 6A illustrates visible light excitation where the paste boundary can be seen but none of the paste-covered SRO boundaries can be seen. The left image of FIG. 6B illustrates the situation with UV2 excitation. In some embodiments a UV2 excitation such as 365 nm wavelength UV illumination can result in a very good fluorescence image for detecting both the paste boundary and the SRO boundary in the embodiment under discussion. At the same time, since the paste is solid and opaque, in some embodiments either a UV1 excitation such as a 280 nm wavelength UV illumination imaging, or visible light illumination imaging can be used to provide the needed fluorescence to detect the paste boundary. Combining the two images in FIG. 6B, the images of the solder paste can be easily segmented from SRO and SR. In some embodiments, the images can be combined or manipulated by use of software. In one embodiment, Matlab™, which is a proprietary programming language developed by MathWorks™, was used for combining and manipulating the images for this purpose. However, other common image processing and computer vision libraries such as OpenCV™ (open source), VisionPro™ from Cognex™, Halcon™ from MVTec™ can also be adopted for such type of image processing task with essentially the same results. This technique overcomes the limits of other 2D imaging tools to find the buried SROs. For example, in FIG. 6B both the SRO boundary 601 and the SR boundary 602 can be seen.

Figure 7:
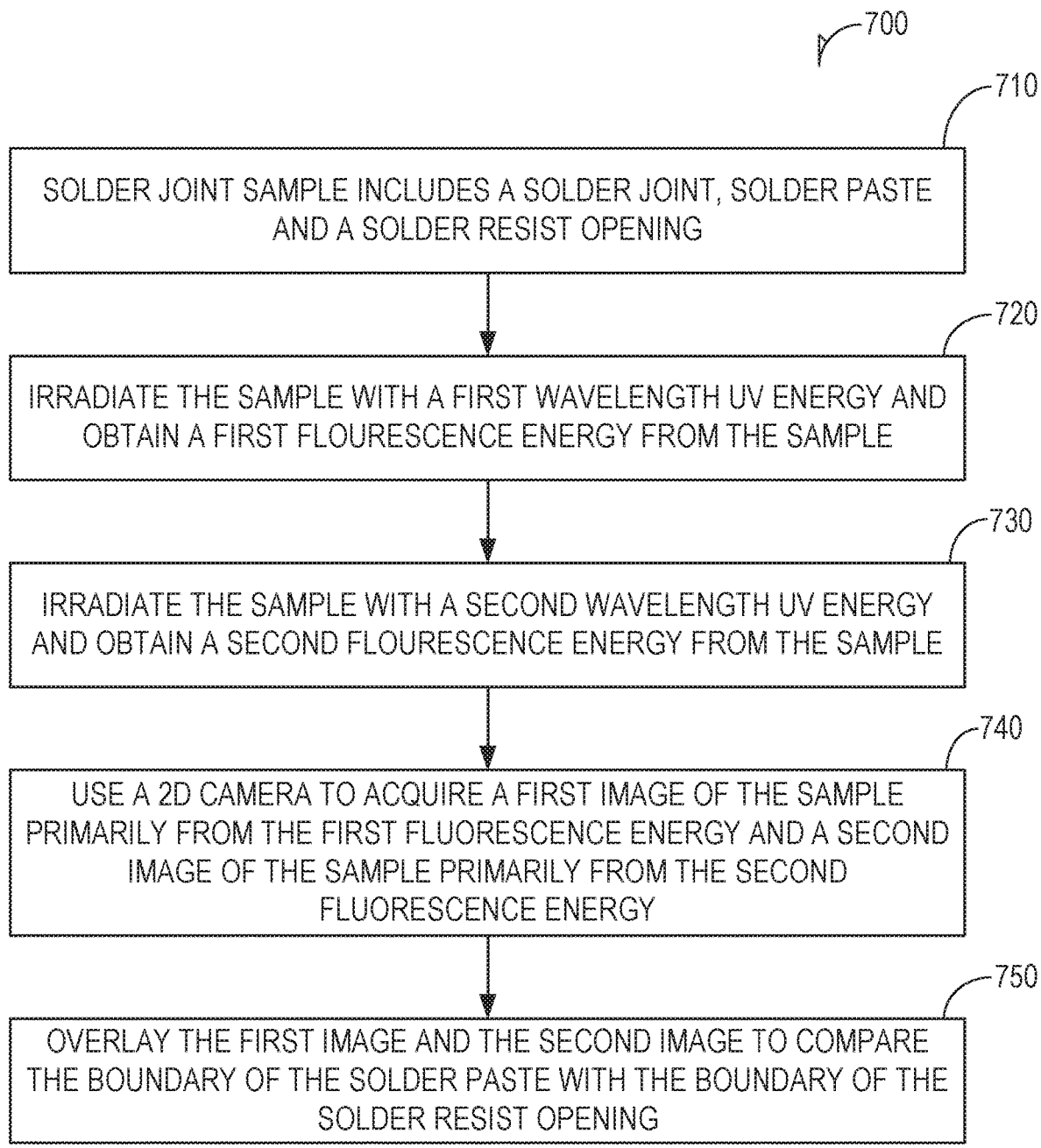
FIG. 7 is a flow chart of method, according to some embodiments.
Figure 8:
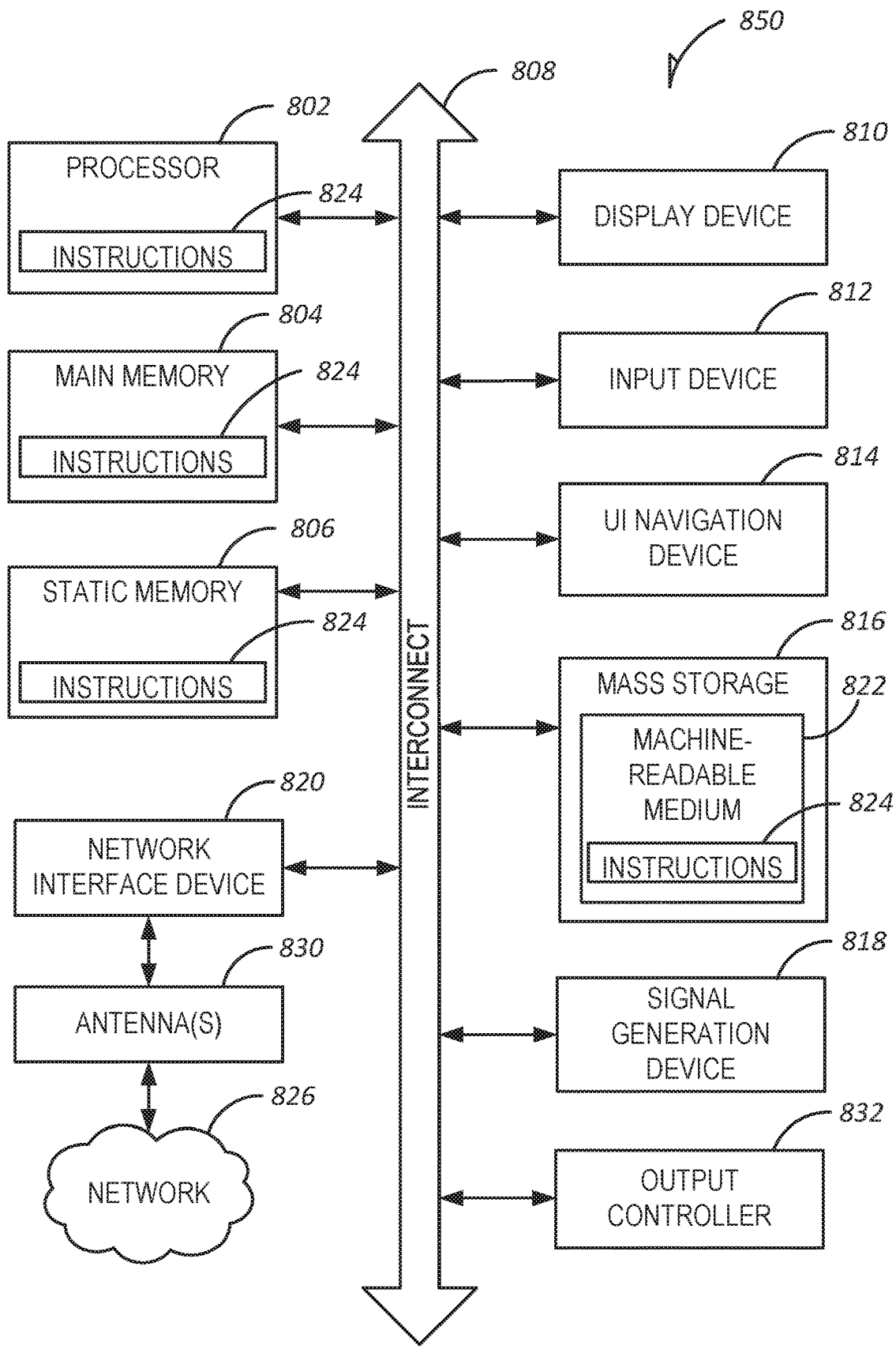
FIG. 8 illustrates a block diagram of an example machine upon which, or by which, any one or more of the processes, techniques (e.g., methodologies) discussed herein that involve calculation or measurement may be performed, according to some embodiments.

FIG. 7 is a flowchart of a method, 700, according to some embodiments. At 710, a solder joint sample that includes a solder joint, a solder paste and a solder resist opening is obtained for test. At 720 the sample is irradiated with a first wavelength UV energy which, as discussed above, may be in the range of 250±50 nm in some embodiments. This irradiation results in a first fluorescence energy from the sample. As further discussed above, this fluorescence energy may be in the range of 325 nm and longer, in some embodiments. At 730 the sample is irradiated with a second wavelength UV energy which, as discussed above, may in the range of 350±50 nm in some embodiments. This irradiation results in a second fluorescence energy from the sample. As discussed above, this fluorescence may be in the range of 418 nm and above, in some embodiments. At 740 a 2D camera is used to acquire a first image of the sample primarily from the first fluorescence energy and to acquire a second image of the sample primarily from the second fluorescence energy. At 750 the two images may be overlaid by appropriate software to visually compare the boundary of the solder paste and the boundary of the solder resist. Results of the comparison are discussed above with respect to FIGS. 5A-C and FIG. 6A-B.

In summary, the described multi-level fluorescence imaging technique is a powerful and exceptional solution for BA SPI 2D metrology. The measurement accuracy can be substantially improved due to the merit of fluorescence imaging to enhance imaging contrast. This core 2D metrology technique can be integrated onto 3D commercial tools.

FIG. 7 illustrates a block diagram of an example machine 750 upon which, or by which, any one or more of the processes, techniques (e.g., methodologies) discussed herein that involve calculation or measurement may be performed, in some embodiments. In alternative embodiments, the machine 750 may operate as a standalone device or may be connected (e.g., networked) to other machines. In a networked deployment, the machine 750 may operate in the capacity of a server machine, a client machine, or both in server-client network environments. In an example, the machine 750 may act as a peer machine in peer-to-peer (P2P) (or other distributed) network environment. The machine 750 may be a personal computer (PC), a tablet PC, a set-top box (STB), a personal digital assistant (PDA), a mobile telephone, a smart phone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Machine (e.g., computer system) may include a hardware processor 802 (e.g., a central processing unit (CPU), a graphics processing unit (GPU), a hardware processor core, or any combination thereof), a main memory 804 and a static memory 806, some or all of which may communicate with each other via an interlink (e.g., bus) 808. The machine 850 may further include a display unit 810, an alphanumeric input device 812 (e.g., a keyboard), and a user interface (UI) navigation device 814 (e.g., a mouse). In an example, the display unit 810, input device 812 and UI navigation device 814 may be a touch screen display. The machine 850 may additionally include a storage device (e.g., drive unit) 816, a signal generation device 818 (e.g., a speaker), a network interface device 820, and one or more sensors, such as a global positioning system (GPS) sensor, compass, accelerometer, or other sensor. The machine 850 may include an output controller 828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 816 may include a machine readable medium 822 on which is stored one or more sets of data structures or instructions 824 (e.g., software) embodying or utilized by any one or more of the techniques or functions described herein. The instructions 824 may also reside, completely or at least partially, within the main memory 804, within static memory 806, or within the hardware processor 802 during execution thereof by the machine. In an example, one or any combination of the hardware processor 802, the main memory 804, the static memory 806, or the storage device 816 may constitute machine readable media.

While the machine readable medium 822 is illustrated as a single medium, the term "machine readable medium" may include a single medium or multiple media (e.g., a centralized or distributed database, and/or associated caches and servers) configured to store the one or more instructions 824.

The term "machine readable medium" may include any medium that is capable of storing, encoding, or carrying instructions for execution by the machine and that cause the machine to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); Dynamic Random Access Memory (DRAM); and CD-ROM and DVD-ROM disks. In some examples, machine readable media may include non-transitory machine readable media. In some examples, machine readable media may include machine readable media that is not a transitory propagating signal.

The instructions 824 may further be transmitted or received over a communications network 826 using a transmission medium via the network interface device 820 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 820 may include one or more physical jacks (e.g., Ethernet, coaxial, or phone jacks) or one or more antennas to connect to the communications network 826. In an example, the network interface device 820 may include a plurality of antennas to wirelessly communicate using at least one of single-input multiple-output (SIMO), multiple-input multiple-output (MIMO), or multiple-input single-output (MISO) techniques. In some examples, the network interface device 820 may wirelessly communicate using Multiple User MIMO techniques. The term "transmission medium" shall be taken to include any intangible medium that is capable of storing, encoding or carrying instructions for execution by the machine, and includes digital or analog communications signals or other intangible medium to facilitate communication of such software.

EXAMPLES

Example 1 is a method of solder paste inspection comprising: irradiating a sample solder joint comprising an organic material, an organic and metal material enclosed by an irregular boundary, and a metal material enclosed by a regular boundary, with a first wavelength energy and detecting first fluorescence energy at a third wavelength; irradiating the sample with a second wavelength energy and detecting second fluorescence energy at a fourth wavelength; acquiring, by a two-dimensional (2D) camera, a first image of the sample primarily from the first fluorescence energy at the third wavelength and a second image of the sample primarily from the second fluorescence energy at the fourth wavelength; and overlaying the first image and the second image to compare the boundary of the organic and metal material with the boundary of the metal material.

In Example 2, the subject matter of Example 1 optionally includes wherein the first wavelength energy is ultraviolet light and the second wavelength energy is ultraviolet light.

In Example 3, the subject matter of Examples 1-2 optionally includes wherein the organic material comprises a solder resist, the organic and metal material comprises a solder paste, and the metal material comprises a solder resist opening (SRO).

In Example 4, the subject matter of any one or more of Examples 1-3 optionally includes wherein the solder paste is a low metal loaded paste.

In Example 5, the subject matter of any one or more of Examples 1-4 optionally includes wherein the solder paste is a high metal loaded paste.

In Example 6, the subject matter of any one or more of Examples 1-5 optionally includes wherein the first wavelength is within the range of $=250\pm50$ nm and the second wavelength is within the range of $\lambda=350\pm50$ nm In Example 7, the subject matter of any one or more of Examples 1-6 optionally includes wherein the third wavelength is within the range of $\lambda=325$ nm and longer, and the fourth wavelength is within the range of $\lambda=418$ nm and longer.

In Example 8, the subject matter of any one or more of Examples 5-7 optionally includes wherein the first wavelength is 280 nm and the second wavelength is 365 nm.

In Example 9, the subject matter of any one or more of Examples 1-8 optionally includes wherein the regular boundary comprises the organic material.

In Example 10, the subject matter of any one or more of Examples 1-9 optionally includes wherein the irregular boundary covers the entire regular boundary and the irregular boundary is visually inseparable from the regular boundary under visible light.

In Example 11, the subject matter of any one or more of Examples 3-10 optionally includes wherein the irregular boundary does not cover the regular boundary and the overlaying of the first image and the second image presents an image of metal of the SRO.

In Example 12, the subject matter of any one or more of Examples 1-11 optionally includes wherein the first wavelength energy and the second wavelength energy are transmitted via a switchable low pass filter.

In Example 13, the subject matter of any one or more of Examples 1-12 optionally includes wherein detecting first fluorescence energy and the second fluorescence energy are detected via a switchable long pass filter.

In Example 14, the subject matter of any one or more of Examples 5-13 optionally includes wherein either an excitation within the range of $\lambda=250\pm50$ nm, or a visible light excitation provides fluorescence for imaging the irregular boundary.

In Example 15, the subject matter of Example 3 optionally includes wherein the first excitation is within the range $\lambda=250\pm50$ nm and the second excitation is within the range $\lambda=350\pm50$ nm.

In Example 16, the subject matter of Example 15 optionally includes wherein the first excitation is at 280 nm wavelength and the second excitation is at a 365 nm wavelength.

In Example 17 is an apparatus for solder paste inspection comprising: A light source configured to: irradiate a sample solder joint comprising an organic material, an organic and metal material enclosed by an irregular boundary, and a metal material enclosed by a regular boundary, with a first wavelength energy to obtain first fluorescence energy at a third wavelength, and irradiate the sample with a second wavelength energy to obtain second fluorescence energy at a fourth wavelength; a two-dimensional (2D) camera configured to acquire a first image of the sample primarily from the first fluorescence energy at the third wavelength and a second image of the sample primarily from the second fluorescence energy at the fourth wavelength; and photo manipulation software stored on at least one hardware processor, the photo manipulation software configured to overlay the first image and the second image to visually compare the boundary of the organic and metal material with the boundary of the metal material.

In Example 18, the subject matter of Example 17, the subject matter of Example 16 optionally includes wherein the first wavelength energy is ultraviolet light and the second wavelength energy is ultraviolet light.

In Example 19, the subject matter of any one or more of Examples 17-18 optionally includes wherein the 2D camera is a large field of view camera.

In Example 20, the subject matter of any one or more of Examples 17-19 optionally includes at least one filter configured to switch the light source between the first wavelength energy and the second wavelength energy.

In Example 21, the subject matter of any one or more of Examples 17-20 optionally includes further comprising at least one long pass filter is configured to allow the 2D camera to receive fluorescence energy at the third wavelength and at the fourth wavelength.

In Example 22, the subject matter of any one or more of Examples 17-21 optionally includes wherein the sample comprises one sample of a plurality of samples on a sample surface, and the plurality of samples are affixed to an XY motion stage that is used to switch fields of view to allow the 2D camera to cover the full sample surface.

In Example 23, the subject matter of any one or more of Examples 17-22 optionally includes wherein the organic material comprises a solder resist, the organic and metal material comprises a solder paste, and the metal material comprises a solder resist opening (SRO).

In Example 24, the subject matter of Example 23 optionally includes wherein the solder paste is a low metal loaded paste.

In Example 25, the subject matter of any one or more of Examples 23-24 optionally includes wherein the solder paste is a high metal loaded paste.

In Example 26, the subject matter of any one or more of Examples 17-25 optionally includes wherein the first wavelength is within the range of $\lambda=250$-50 nm and the second wavelength is within the range of $\lambda=350\pm50$ nm.

In Example 27, the subject matter of any one or more of Examples 17-26 optionally includes wherein the third wavelength is within the range of $\lambda=325$ nm and longer, and the second fourth wavelength is within the range of $\lambda=418$ nm and longer.

In Example 28, the subject matter of Example 26 optionally includes wherein the first wavelength is 280 nm and the second wavelength is 365 nm.

In Example 29, the subject matter of any one or more of Examples 17-28 optionally includes wherein regular boundary comprises the organic material.

In Example 30, the subject matter of any one or more of Examples 17-29 optionally includes wherein the irregular boundary covers the entire regular boundary and the irregular boundary is visually inseparable from the regular boundary under visible light.

In Example 31, the subject matter of Example 23 optionally includes wherein the irregular boundary does not cover the regular boundary and the overlaying of the first image and the second image presents an image of metal of the SRO.

In Example 32, the subject matter of any one or more of Examples 17-31 optionally includes wherein the first wavelength energy and the second wavelength energy are transmitted via a switchable low pass filter.

In Example 33, the subject matter of any one or more of Examples 17-32 optionally includes wherein the first fluorescence energy and the second fluorescence energy are detected via a switchable long pass filter.

In Example 34, the subject matter of Example 25 optionally include wherein either an excitation within the range of $\lambda=250\pm50$ nm, or a visible light excitation provides fluorescence for imaging the irregular boundary.

In Example 35, the subject matter of Example 24 optionally includes wherein the first excitation is within the range $\lambda=250\pm50$ nm and the second excitation is within the range $\lambda=350\pm50$ nm.

In Example 36, the subject matter of Example 35 optionally includes wherein the first excitation is at 280 nm wavelength and the second excitation is at a 365 nm wavelength.

In Example 37, the subject matter can include, or can optionally be combined with any portion or combination of, any portions of any one or more of Examples 1 through 36 to include, subject matter that can include means for performing any one or more of the functions of Examples 1 through 36, or a machine-readable medium including instructions that, when performed by a machine, cause the machine to perform any one or more of the functions of Examples 1 through 36.

All features of the apparatuses described above (including optional features) may also be implemented with respect to the methods or processes described herein.

The invention claimed is:

1. A method of solder paste inspection comprising:
   irradiating a sample solder joint comprising an organic material, an organic and metal material enclosed by an irregular boundary, and a metal material enclosed by a regular boundary, with a first wavelength energy and detecting first fluorescence energy at a third wavelength;
   irradiating the sample with a second wavelength energy and detecting second fluorescence energy at a fourth wavelength;
   acquiring, by a two-dimensional (2D) camera, a first image of the sample primarily from the first fluorescence energy at the third wavelength and a second image of the sample primarily from the second fluorescence energy at the fourth wavelength; and
   overlaying the first image and the second image to compare the boundary of the organic and metal material with the boundary of the metal material.

2. The method of claim 1 wherein the first wavelength energy is ultraviolet light and the second wavelength energy is ultraviolet light.

3. The method of claim 2, wherein the organic material comprises a solder resist, the organic and metal material comprises a solder paste, and the metal material comprises a solder resist opening (SRO).

4. The method of claim 3 wherein the solder paste is a low metal loaded paste.

5. The method of claim 3 wherein the solder paste is a high metal loaded paste.

6. The method of claim 2 wherein the first wavelength is within the range of $\lambda=250\pm50$ nm and the second wavelength is within the range of $\lambda=350\pm50$ nm.

7. The method of claim 2 wherein the third wavelength is within the range of $\lambda=325$ nm and longer, and the fourth wavelength is within the range of $\lambda=418$ nm and longer.

8. The method of claim 6 wherein the first wavelength is 280 nm and the second wavelength is 365 nm.

9. The method of claim 2 wherein the regular boundary comprises the organic material.

10. The method of claim 2 wherein the irregular boundary covers the entire regular boundary and the irregular boundary is visually inseparable from the regular boundary under visible light.

11. The method of claim 3 wherein the irregular boundary does not cover the regular boundary and the overlaying of the first image and the second image presents an image of metal of the SRO.

12. The method of claim 2 wherein the first wavelength energy and the second wavelength energy are transmitted via a switchable low pass filter.

13. The method of claim 2 wherein the first fluorescence energy and the second fluorescence energy are detected via a switchable long pass filter.

14. The method of claim 5 wherein either an excitation within the range of $\lambda=250\pm50$ nm, or a visible light excitation provides fluorescence for imaging the irregular boundary.

15. The method of claim 3 wherein the first excitation is within the range $\lambda=250\pm50$ nm and the second excitation is within the range $\lambda=350\pm50$ nm.

16. The method of claim 15 wherein the first excitation is at 280 nm wavelength and the second excitation is at a 365 nm wavelength.

17. An apparatus for solder paste inspection comprising:
A light source configured to:
  irradiate a sample solder joint comprising an organic material, an organic and metal material enclosed by an irregular boundary, and a metal material enclosed by a regular boundary, with a first wavelength energy to obtain first fluorescence energy at a third wavelength, and
  irradiate the sample with a second wavelength energy to obtain second fluorescence energy at a fourth wavelength;
a two-dimensional (2D) camera configured to acquire a first image of the sample primarily from the first fluorescence energy at the third wavelength and a second image of the sample primarily from the second fluorescence energy at the fourth wavelength; and
photo manipulation software stored on at least one hardware processor, the photo manipulation software configured to overlay the first image and the second image to visually compare the boundary of the organic and metal material with the boundary of the metal material.

18. The apparatus of claim 17 wherein the first wavelength energy is ultraviolet light and the second wavelength energy is ultraviolet light.

19. The apparatus of claim 18 wherein the 2D camera is a large field of view camera.

20. The apparatus of claim 18 further comprising at least one filter configured to switch the light source between the first wavelength energy and the second wavelength energy.

21. The apparatus of claim 18 further comprising at least one long pass filter is configured to allow the 2D camera to receive fluorescence energy at the third wavelength and at the fourth wavelength.

22. The apparatus of claim 18 wherein the sample comprises one sample of a plurality of samples on a sample surface, and the plurality of samples are affixed to an XY motion stage that is used to switch fields of view to allow the 2D camera to cover the full sample surface.

23. The apparatus of claim 18, wherein the organic material comprises a solder resist, the organic and metal material comprises a solder paste, and the metal material comprises a solder resist opening (SRO).

24. The apparatus of claim 23 wherein the solder paste is a low metal loaded paste.

25. The apparatus of claim 23 wherein the solder paste is a high metal loaded paste.

26. The apparatus of claim 18 wherein the first wavelength is within the range of $\lambda=250\pm50$ nm and the second wavelength is within the range of $\lambda=350\pm50$ nm.

27. The apparatus of claim 18 wherein the third wavelength is within the range of $\lambda=325$ nm and longer, and the second fourth wavelength is within the range of $\lambda=418$ nm and longer.

28. The apparatus of claim 26 wherein the first wavelength is 280 nm and the second wavelength is 365 nm.

29. The apparatus of claim 18 wherein regular boundary comprises the organic material.

30. The apparatus of claim 18 wherein the irregular boundary covers the entire regular boundary and the irregular boundary is visually inseparable from the regular boundary under visible light.

31. The apparatus of claim 23 wherein the irregular boundary does not cover the regular boundary and the overlaying of the first image and the second image presents an image of metal of the SRO.

32. The apparatus of claim 18 wherein the first wavelength energy and the second wavelength energy are transmitted via a switchable low pass filter.

33. The apparatus of claim 18 wherein the first fluorescence energy and the second fluorescence energy are detected via a switchable long pass filter.

34. The apparatus of claim 25 wherein either an excitation within the range of $\lambda=250\pm50$ nm, or a visible light excitation provides fluorescence for imaging the irregular boundary.

35. The apparatus of claim 24 wherein the first excitation is within the range $\lambda=250\pm50$ nm and the second excitation is within the range $\lambda=350\pm50$ nm.

36. The apparatus of claim 35 wherein the first excitation is at 280 nm wavelength and the second excitation is at a 365 nm wavelength.

* * * * *